(12) United States Patent
Nishibayashi et al.

(10) Patent No.: US 6,423,982 B2
(45) Date of Patent: Jul. 23, 2002

(54) DIAMOND INTERCONNECTION SUBSTRATE AND A MANUFACTURING METHOD THEREFOR

(75) Inventors: Yoshiki Nishibayashi; Takashi Matsuura; Takahiro Imai, all of Itami (JP)

(73) Assignees: Japan Fine Ceramics Center, Nagoya; Sumitomo Electric Industries, Ltd., Osaka, both of (JP)

(*) Notice: Subject to any disclaimer, the term of this patent is extended or adjusted under 35 U.S.C. 154(b) by 0 days.

(21) Appl. No.: 09/765,238

(22) Filed: Jan. 16, 2001

(30) Foreign Application Priority Data

Jan. 19, 2000 (JP) ........................................ 2000-010708

(51) Int. Cl.$^7$ ......................................... H01L 31/0312
(52) U.S. Cl. ........................... 257/77; 257/328; 257/506
(58) Field of Search ........................... 257/77, 328, 506, 257/190; 438/513, 475, 506

(56) References Cited

U.S. PATENT DOCUMENTS 5,506,422 A * 4/1996 Dreifus et al. ................ 257/77
5,744,825 A * 4/1998 Zachai et al. .................. 257/77
6,027,988 A * 2/2000 Cheung et al. ............. 438/513
6,124,622 A * 9/2000 Tsutsumi ..................... 257/506
6,251,754 B1 * 6/2001 Oshima et al. ............. 438/506
6,274,459 B1 * 8/2001 Chan ........................... 438/475

OTHER PUBLICATIONS

"Highly efficient electron emitting diode of single crystalline CVD diamond", by M. Nishimura et al.; Abstract of the 12$^{th}$ JNDF Diamond Symposium, Nov. 24–25, 1998, Tokyo, Japan, pp. 168–169.

* cited by examiner

*Primary Examiner*—David Nelms
*Assistant Examiner*—Thinh T Nguyen
(74) *Attorney, Agent, or Firm*—W. F. Fasse; W. G. Fasse

(57) ABSTRACT

An electrical connection board includes a diamond substrate and an implantation metal layer constituted by the presence of metal elements in the diamond substrate. The metal layer has a thickness of at least 10 nm and a concentration of at least $10^{20}$ cm$^{-3}$ in the diamond substrate. The implantation metal layer is formed by ion implanting metal elements with a high energy level of at least 1 MeV and a high dose of at least $10^{16}$ cm$^{-2}$. Thus, a technique is provided by which a multi-layer electrical interconnection is realized in the diamond substrate having the highest thermal conductivity of all known materials.

12 Claims, 18 Drawing Sheets

ION IMPLANTATION METHOD (1)

ION IMPLANTATION METHOD (2)

MEASUREMENT METHOD (1)

MEASUREMENT METHOD (2)

MEASUREMENT METHOD (2)

SYNTHESIZING OF DIAMOND BY VAPOR SYNTHESIZING PROCESS

DIAMOND INTERCONNECTION SUBSTRATE AND A MANUFACTURING METHOD THEREFOR

BACKGROUND OF THE INVENTION

1. Field of the Invention

The present invention relates to a diamond interconnection substrate and a manufacturing method therefor, and more particularly to those applicable to a high-power electronic circuit substrate including a high power microwave circuit, which is a diamond circuit substrate, also serving as a heat sink, having multi-layer interconnections.

2. Description of the Background Art

Diamond is a material having the highest thermal conductivity of all materials, in a high temperature range between a room temperature and 200° C. Such a property is considered to be important for a heat sink required for lowering temperature of electron devices having, year by year, higher performance and greater heat-releasing values. Conventionally, when utilized as a high-performance heat sink, diamond may be provided with an interconnection of only one layer formed on the surface of the diamond. Thus, a conventional diamond interconnection substrate has attained only one layer of interconnection.

However, when a number of elements are formed on the diamond substrate, the interconnections may cross with each other in the only one interconnection layer. Further, miniaturization of a device may possibly make an interconnection thinner, which will require the interconnection to be electrical power resistant.

Currently, ceramics and conductors are used for circuit substrates, and a combination of simultaneously calcinable $Al_2O_3/W$, $AlN/W$ or the like are selected as materials therefor. Some circuit substrates are designed to utilize CuW material, a low-temperature calcinated substrate and so forth, to be divided into a heat radiating portion and a multi-layer interconnection portion. Further, a multi-layer interconnection substrate of BeO is being contemplated in a field where both a highly thermal conductive material and a multi-layer interconnection technique are required.

However, such a circuit substrate had problems in that the thermal conductivity is lower compared to that of diamond, its structure is more complicated and its manufacturing process is troublesome.

SUMMARY OF THE INVENTION

It is an object of the present invention to provide a technique by which multi-layer interconnections can be realized using a diamond substrate with the highest thermal conductivity of all materials, in a packaging field for high power microwave and milliwave communications requiring a high thermal conductivity and a multi-layer interconnection technique.

A diamond interconnection substrate according to the present invention includes diamond, and a conductive layer constituted by a presence of metal elements having a thickness of at least 10 nm and a concentration of at least $10^{20}$ $cm^{-1}$ in the diamond. More effectively, the conductive layer is constituted by the presence of metal elements having a thickness of at least 100 nm and a concentration of at least $10^{21}$ $cm^{-3}$.

To solve the problems described above, the diamond interconnection substrate of the present invention utilizes diamond having a thermal conductivity of approximately 2000 W/mK for the substrate, in which interconnections are provided within the diamond by implanting metal ions into the diamond substrate with a high energy level and a high dose.

Diamond is constituted by carbon atoms, each of which being a light element, and, different from Si and so forth, ions can enter very deeply into the diamond when implanted at a high speed. Further, fast ions (on the order of MeV) have a property in which a scattering cross section is small as long as the ions are at the high speed, so that they hardly collide with elements in a diamond crystal. Hence, the ions pass through the crystal without damaging the crystal. However, the scattering cross section is increased and the ions are rapidly stalled once the ions are decelerated in a substance, so that concentrated implantation is possible in a very narrow region.

Further, use of a mask enables forming of interconnections that are patterned together. That is, the interconnections can be formed with excellent controllability in depth and plane directions. It is also possible to attain a density value in the diamond very close to a density of metal, with a practical implant dose. This means that transfer of a substance, other than simple doping of elements into the diamond is possible.

Further, in a case that a conventional substance is used as a substrate material, when ions are implanted, energy of implanted elements may locally increase temperature and pressure of the material originally constituting the substrate, which may destroy the material. On the other hand, diamond has a high thermal conductivity such that it is hard to be heated to a high temperature, and also is very strongly bonded so as not to be destroyed.

Therefore, implantation of fast metal ions into the diamond substrate can produce an electrical interconnection area or areas within the diamond.

The diamond may be a monocrystal or a polycrystal, and either will have almost the same effect. Further, the effect described above can be attained even if an impurity is present in the diamond, since no doping is performed.

Further, interconnections are provided within the diamond, so that no gap can be formed between the diamond and the interconnections, and thus the interconnections cannot be corroded nor oxidized by acid or a severe environmental atmosphere. Thus, corrosive metals of alkali metals or alkaline earth metals may be utilized for the interconnections. It is understood that refractory metals of W, Mo, Nb, Pt and Ir may also be used. Lighter elements such as Li and Na of the metal elements can be implanted deeper, thereby causing less damage to the diamond.

Further, since the diamond substrate has a high thermal conductivity, heat of the metal interconnection is readily dissipated, so that even a low melting metal material has an electrical power transmission capability.

Preferably, the diamond interconnection substrate includes a plurality of conductive layers, the plurality of conductive layers being disposed at different depth positions with various distances from a surface of the diamond.

This can realize a multi-layer interconnection structure, facilitates arrangement of interconnections, and also realizes integration.

Preferably, in the diamond interconnection substrate, the plurality of conductive layers are electrically connected with each other in the diamond.

This allows each conductive layer to be electrically connected with each other.

Preferably, the diamond interconnection substrate further includes at least one electrode formed on the surface of the diamond, and at least one of the plurality of conductive layers is electrically connected to the at least one electrode.

This enables the conductive layers to be electrically connected to other circuit elements through the electrode.

Preferably, in the diamond interconnection substrate, the metal elements constituting the conductive layer are metal elements of at least one species selected from a group consisting of Cu, Ag, Au, Pt, Mg and Al.

Thus, a material can be selected as appropriate, and a low-melting/low-resistant material can be used to form the interconnections.

A method of manufacturing a diamond interconnection substrate according to the present invention includes the step of ion implanting metal elements with energy of at least 1 MeV and a dose of at least $10^{16}$ cm$^{-2}$ into diamond to form a conductive layer constituted by at least one metal element.

According to the manufacturing method of the diamond interconnection substrate of the present invention, the conductive layers that are to be interconnections can be formed within the diamond as described above, by ion implantation with the high energy (at least 1 MeV) and the high dose (at least $10^{16}$ cm$^{-2}$).

Preferably, in the method of manufacturing a diamond interconnection substrate, the ion implanting is performed a number of times by varying implantation depths of the metal elements into the diamond.

Implantation at different implantation depths can provide various arrangement positions and shapes of the conductive layers.

The implantation depth can be changed by varying implantation energy. For example, if Cu ions are implanted with various energy levels such as 8 MeV, 6 MeV and 4 MeV, profiles of Cu ions implanted in respective implantation processes are partly overlapped with each other and are stacked in the depth direction.

Alternatively, the implantation depth can be varied even with a constant energy, by disposing an interposition somewhere in an ion implantation path. For example, there is a method of implanting ions in multiple stages, in which ions are first implanted with the energy level of 8 MeV without any interpositions in the implantation path. Thereafter ions are implanted with a thin (100 to 200 nm) metal layer interposed somewhere in the implantation path. Then, ions are further implanted with a thicker metal layer interposed in the implantation path. In such a case, the interposition metal layers serve as decelerating layers for the implantation, which effectively varies the energy level of the implantation ions in the diamond, resulting in various implantation depths. This allows the profiles of Cu ions implanted in respective stages to be partly overlapped with each other and stacked in the depth direction.

Alternatively, the implantation depth can also be varied by changing ion species to be implanted, even with the same energy level. For example, when Al ions are implanted with 5 MeV and Cu is implanted with 8 MeV, the respective profiles of Al ions and Cu ions are overlapped with each other. When the implantation profiles are thus overlapped, a width of the implantation region in the depth direction will be thicker compared to that of a single implantation profile alone, and further a resistance value of the implantation region will be lowered. Thus, implantation of different ion species can control the thickness of the conductive layers.

Preferably, in the method of manufacturing a diamond interconnection substrate, profiles of the metal elements implanted by several ion implanting steps are overlapped with each other while being stacked in a depth direction to form a single conductive layer.

As described above, by changing the implantation depth for each ion implantation in a plurality of ion implantation steps, it will be possible to stack the profiles of metal elements implanted in the respective implantation steps in the depth direction.

Preferably, in the method of manufacturing a diamond interconnection substrate, profiles of the metal elements implanted by several ion implanting steps are disposed at different depth positions without overlapping with each other, to form a plurality of conductive layers divided in multiple layers.

For example, profiles will not be overlapped when energy levels of 8 MeV and 2 MeV are used to implant Cu, or when 6 MeV is used to implant Al and 4 MeV is used to implant Cu. Thus, implantation depth can be controlled. Further, a method in which at least 1 μm of diamond is formed on an implantation surface by a vapor synthesizing process after one implantation step and thereafter a further implantation step is performed, can be used to form profiles without an overlap (even when the implantation is performed under the same condition). By repeating this once or more than once, arbitrary multi-layered conductive layers can be formed. Further, multi-layer interconnections having arbitrary shapes can also be performed by using masks having different patterns for the respective implantation steps. As such, fabrication of a multi-layer interconnection substrate having an interconnection of an arbitrary shape at an arbitrary interlayer is enabled. Further, the method of controlling the thickness of the conductive layers described earlier can be used to form conductive layers having arbitrary thicknesses at arbitrary layers.

Moreover, if the energy level is changed in a fairly large range and implant ion species are also changed by the method of controlling the thickness of the conductive layers described earlier, the conductive layers can have the thickness ranging from a predetermined depth position to the surface. This method can be utilized for extracting an electrode to the top surface and for forming an electrode connection between metal layers.

It is noted that the implantation, deposition or embedment of a metal layer into a through hole formed after formation of the multi-layer interconnection, also enables a connection between layers and extraction of an electrode to the top surface.

Preferably, in the method of manufacturing a diamond interconnection substrate, at least the implanting energy of the ion implanting or the type of the metal elements is changed to vary an implantation depth of the metal elements in the ion implanting.

This enables formation of conductive layers having different widths (thickness) in the depth direction and formation of a multi-layer interconnection structure, as described above.

Preferably, the method of manufacturing a diamond interconnection substrate further includes the step of synthesizing a diamond layer on a surface of the diamond by a vapor synthesizing process, and the step of ion implanting the metal elements and the step of synthesizing the diamond layer after the ion implanting steps have been repeated to form a multi-layered conductive stack in which the individual layers are disposed on planes different from each other.

Through the characteristics as described above, the present invention allows synthesis of diamond at approximately 1000° C. over the substrate after provision of the interconnections. Thus, by repeating the step of ion implanting metal elements and the step of synthesizing the diamond layer, the total number of the multi-layer interconnections can almost be infinity, and a low melting/low resistivity material (Al, Ag, Au and Mg) can be used for the interconnection metal.

Preferably, in the method of manufacturing a diamond interconnection substrate, a mask layer formed on a surface of the diamond is patterned using a photolithography process, and the ion implanting is performed on the diamond through the patterned mask layer, to form the conductive layer of a predetermined shape.

This enables two-dimensionally controlled patterning by the mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings.

Figure 1:
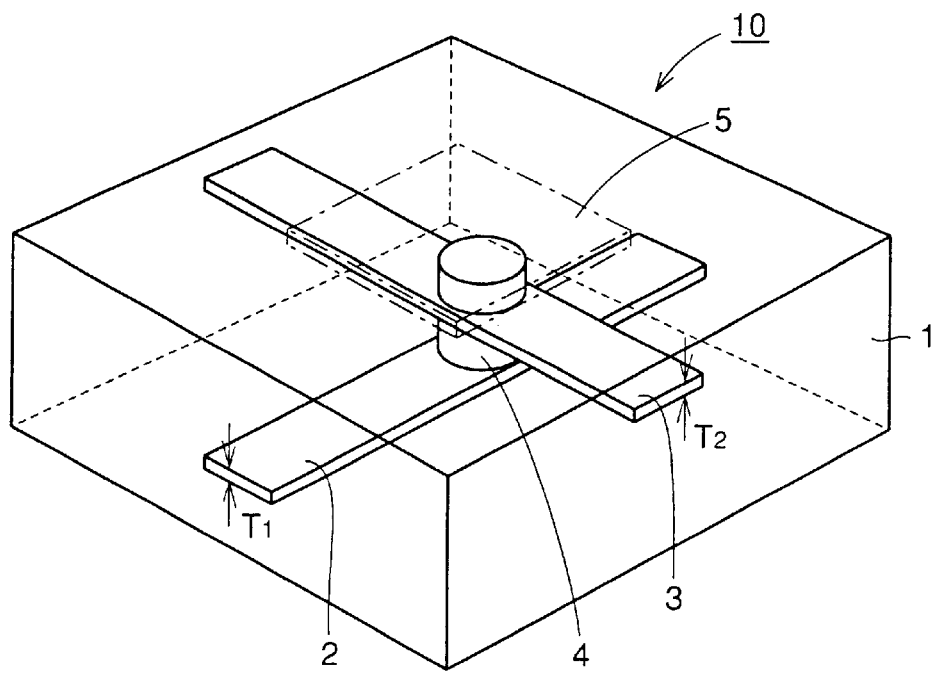
FIG. 1 is a perspective view schematically showing a configuration of a diamond interconnection substrate according to an embodiment of the present invention.

Referring to FIG. 1, a diamond interconnection substrate 10 includes a diamond substrate 1 and conductive layers 2, 3 and 4.

Conductive layers 2, 3 and 4 are formed in diamond substrate 1, and are constituted by the presence of metal elements having a thickness of at least 10 nm and a concentration of at least $10^{20}$ cm$^{-3}$. Thus, a thickness of $T_1$ of conductive layer 2, a thickness $T_2$ of conductive layer 3 and a thickness of conductive layer 4 are all at least 10 nm. It is noted that the metal elements of each conductive layer 2, 3 and 4 preferably have a concentration equal to or less than $10^{22}$ cm$^{-3}$.

Further, for the metal elements included in conductive layers 2, 3 and 4, for example, low-melting/low-resistive Al, Ag, Au, Mg and Cu may be used, or refractory metals such as W, Mo, Nb, Pt and Ir may be used, or corrosive alkali metals or alkaline earth metals may also be used. Conductive layers may be formed on different planes (in different depth positions) as multi-layer interconnections, such as conductive layers 2 and 3. Furthermore, these conductive layers 2 and 3 may be electrically connected with each other by a layer 4 having a thickness or depth sufficient for this purpose. This conductive layer 4 may also reach the surface of the diamond substrate 1 and may electrically contact with an electrode 5 formed on the surface.

Figure 2:
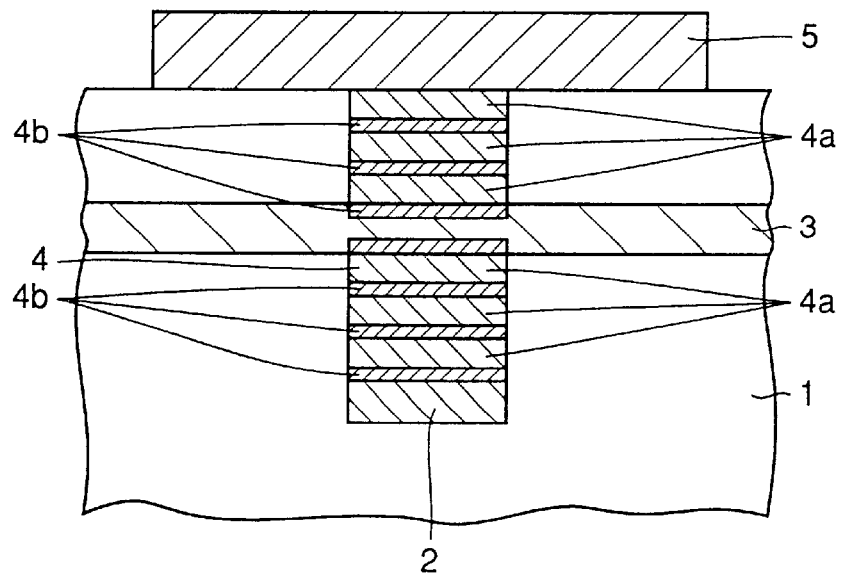
FIG. 2 is a partial section view schematically showing a configuration of a diamond interconnection substrate according to another embodiment of the present invention.

Conductive layer 4 may be formed by conductive regions 4a, each formed in an ion implantation step, stacked in the depth direction while sharing overlapped regions 4b, as shown in the sectional view of FIG. 2. It can also be formed simply from a single metal layer filled in a via hole opened through the surface of diamond substrate 1.

Diamond substrate 1 may be a natural diamond substrate, an artificial (high-pressure synthetic) diamond substrate, a vapor synthesized diamond substrate, a polycrystalline diamond substrate, an alignment-controlled polycrystalline diamond substrate, a hetero-epitaxial substrate, or a monocrystal diamond substrate. The hetero-epitaxial substrate and the monocrystal substrate are required such that no channeling occurs at the time of implantation. As for the polycrystalline substrate, an uneven surface is not preferable because the unevenness would be reflected to conductive layers 2 and 3 constituted by metal elements implanted from the surface. Preferably, a monocrystal substrate, a hetero-epitaxial substrate, an alignment-controlled flat polycrystalline substrate, or a flatly polished polycrystalline substrate is used.

When a high-pressure synthesized diamond is used, the method of forming the diamond may either be (1) a method of forming from a normal steady high-temperature/high-pressure state, or (2) a method of utilizing an impact such as an explosion.

Further, when a vapor synthesized diamond is used, there are various methods of forming the diamond such as:

(1) a method of discharging by a direct or alternating electric field to activate source gas;
(2) a method of heating a thermoelectric emission material to activate source gas;
(3) a method of ion impacting a surface on which diamond grows;
(4) a method of exciting source gas by light such as laser or ultraviolet light; and
(5) a method of burning source gas.

Any of the above is possible for use in the present invention as long as insulation of the substrate itself can be secured. If the substrate is used in a region of a microwave circuit or the like, however, a substrate with low loss of electromagnetic wave is required and care is required especially for a synthesizing method and a synthesized substrate.

A method for manufacturing a diamond interconnection substrate according to an embodiment of the present invention will now be described.

Figure 3:
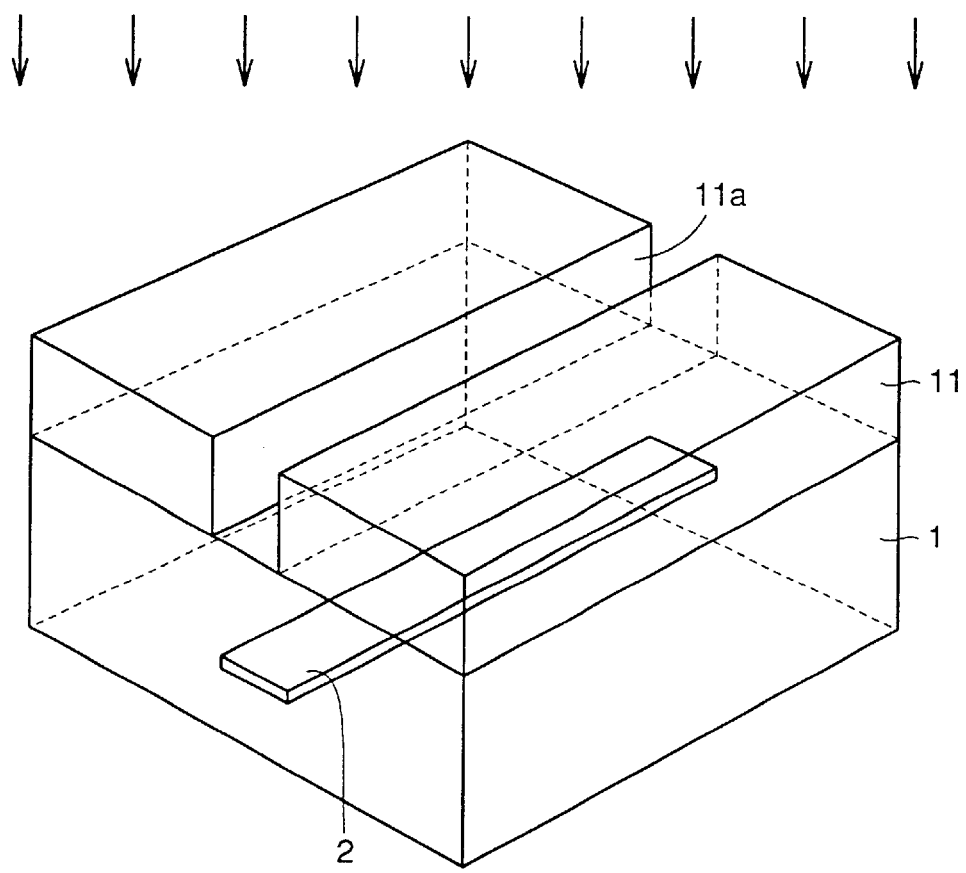
FIGS. 3 to 5 are schematic perspective views sequentially illustrating steps of a manufacturing method of a diamond interconnection substrate according to an embodiment of the present invention.

Referring to FIG. 3, a mask 11 having, for example, a linear opening pattern 11a is formed or disposed on the surface of diamond substrate 1. Through mask 11, metal elements are ion implanted with implanting energy of at least 1 MeV and a dose of at least $10^{16}$ cm$^{-2}$. This forms conductive layer 2 constituted by the presence of metal elements, having a thickness of at least 10 nm and a concentration of at least $10^{20}$ cm$^{-3}$, at a predetermined depth position in the diamond substrate 1.

Figure 4:
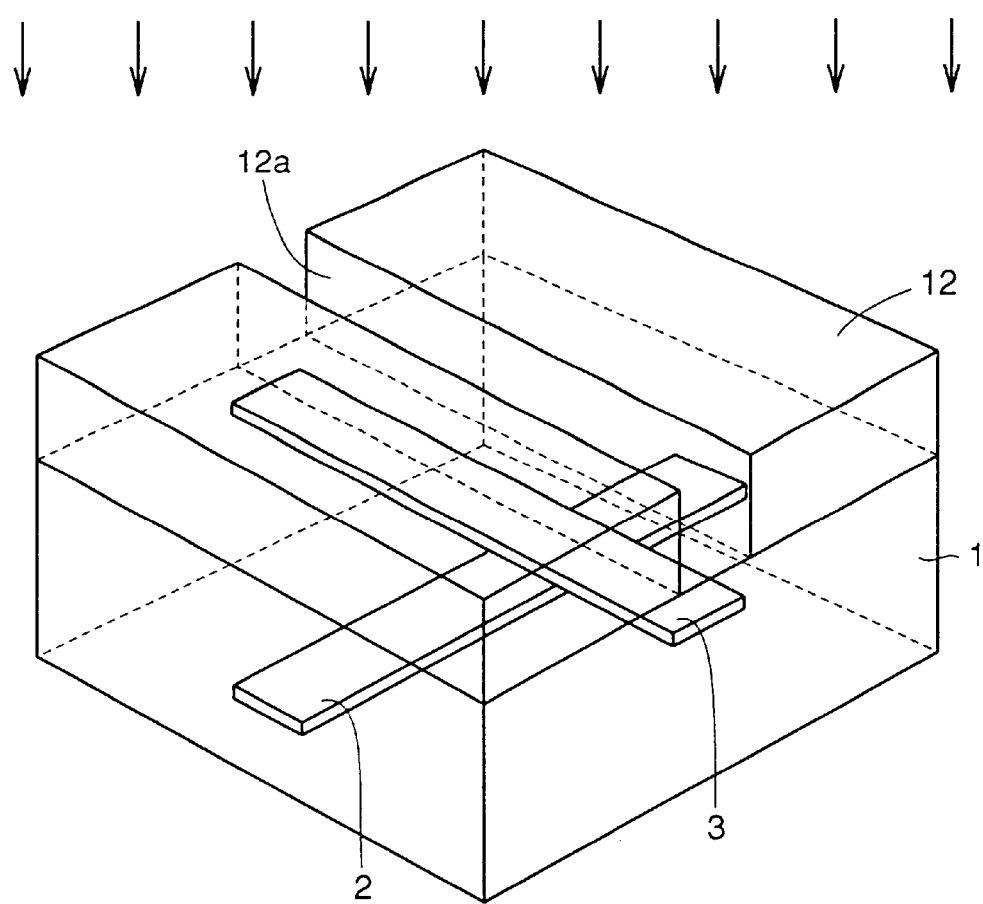

Referring to FIG. 4, a mask 12 having, for example, a linear opening pattern 12a is formed or disposed on the surface of diamond substrate 1. Through mask 12, metal elements are ion implanted with energy of at least 1 MeV and a dose of at least $10^{16}$ cm$^{-2}$. This forms conductive layer 3 constituted by the presence of metal elements, having a thickness of at least 10 nm and a concentration of at least $10^{20}$ cm$^{-3}$, at a position of a depth different from that of the conductive layer 2. The layer formations are achieved under the condition that the energy for implanting the conductive layer 2 is larger than the energy for implanting the conductive layer 1.

Figure 5:
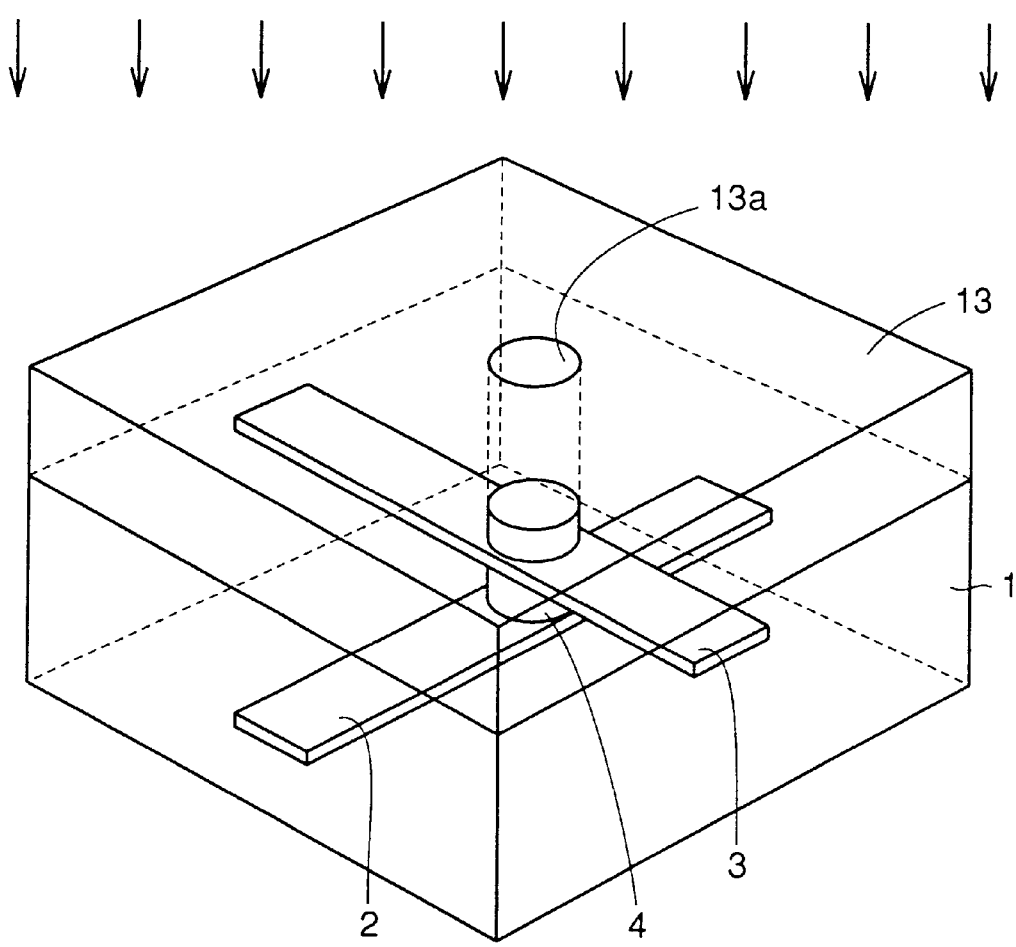

Referring to FIG. 5, a mask 13 having a predetermined opening pattern 13a is formed or disposed on the surface of diamond substrate 1. Through mask 13, metal elements are ion implanted to diamond substrate 1 a number of times with a dose of at least $10^{16}$ cm$^{-2}$ and at various implantation depths. Thus, a plurality of conductive regions 4a having different implantation depths are formed to be overlapped with each other as shown in FIG. 2, resulting in conductive layer 4 which electrically connects conductive layers 2 and 3 while reaching the surface of diamond substrate 1.

It is noted that the implantation depth of the metal elements may be varied by changing a level of ion implanting energy, by changing species of metal elements, or by interposing some layer in the implantation path of the metal elements.

Further, photolithography and etching processes may be used to form a via hole in diamond substrate 1, and then metal or the like may be embedded into the via hole to form a single conductive layer 4.

Mask layers 11, 12 and 13 may also be formed to have opening patterns 11a, 12a and 13a formed by the photolithography process, and may also be metal masks disposed with a distance from the surface of diamond substrate 1.

The diamond interconnection substrate according to the present embodiment may be used for a semiconductor device utilized with high power, for example, for a high-power laser diode for optical amplification of a communication system, as a circuit substrate for microwave output of a communication satellite, and for a power module for controlling high electric power.

EXAMPLES

Examples of the present invention are described below.

Example 1

Figure 6:
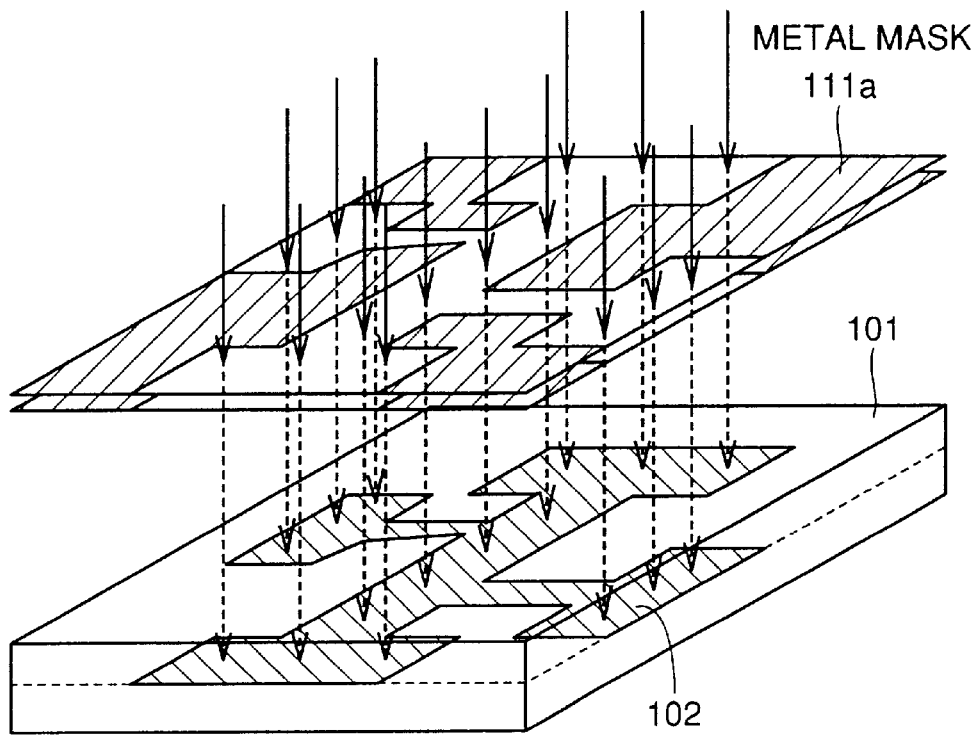
FIG. 6 is a schematic perspective view illustrating formation of an implantation region using a metal mask.
Figure 7:
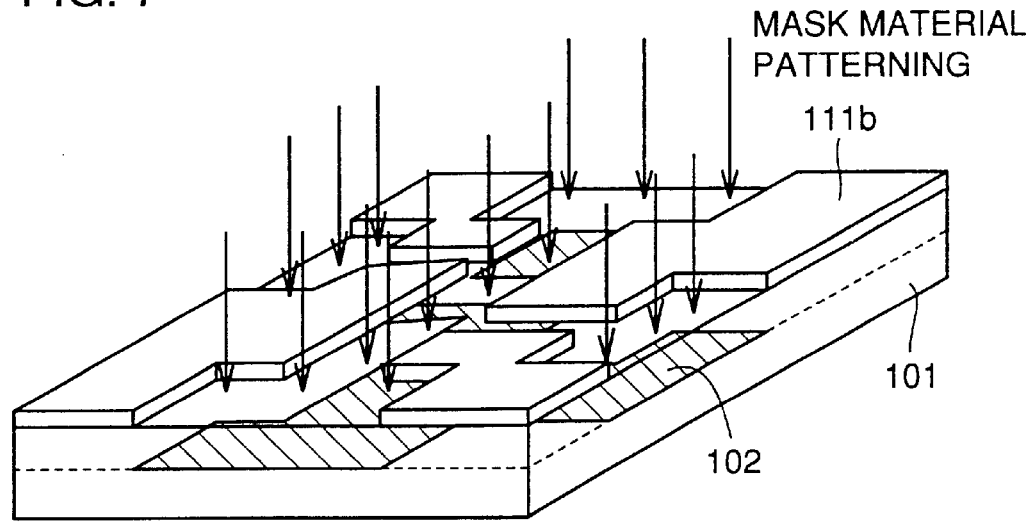
FIG. 7 is a schematic perspective view showing formation of an implantation region using a patterned mask material.

Ion implantation was applied to a monocrystal or polycrystalline diamond substrate 101 with energy of the order of MeV through a metal mask 111a having a pattern shown in FIG. 6. As a result, an implantation region (conductive layer) 102 with a pattern similar to that of metal mask 111a was formed. The implantation region 102 could also be formed by implanting ions with energy of the order of MeV through a patterned mask material 111b as shown in FIG. 7, rather than using metal mask 111a. In this case, implantation region 102 was formed directly below a region where no mask materials were present. Though the film thickness of mask materials 111a and 111b is different depending on their materials and the level of implanting energy, at least 10 μm is required.

Next, variation of the resistance value at the implantation region corresponding to the variation of implanting energy was examined. This variation of the resistance was measured for each ion species of Cu, Al and B. The results are shown in Tables 1 to 3.

Further, variation of the resistance value at the implantation region corresponding to variation of dose was also examined. This was performed for ion species of Cu and Al. The results are shown in Tables 4 and 5.

TABLE 1

Dependency of Implant Layer Resistance to Cu Ion Implant Energy

| Implant Energy (MeV) | Resistance in Measurement Method 1 (Ω) | Resistance in Measurement Method 2 (Ω) |
| --- | --- | --- |
| 1 | ~$10^0$ | ~$10^2$ |
| 2 | ~$10^0$ | ~$10^3$ |
| 4 | ~$10^1$ | ~$10^5$ |
| 6 | ~$10^1$ | ~$10^6$ |
| 8 | ~$10^1$ | >$10^6$ |

Ion Species: Cu
Dose: $10^{17}$ cm$^{-2}$

TABLE 2

Dependency of Implant Layer Resistance to Al Ion Implant Energy

| Implant Energy (MeV) | Resistance in Measurement Method 1 (Ω) | Resistance in Measurement Method 2 (Ω) |
| --- | --- | --- |
| 1 | ~$10^0$ | ~$10^3$ |
| 2 | ~$10^0$ | ~$10^4$ |
| 4 | ~$10^1$ | ~$10^6$ |
| 6 | ~$10^1$ | >$10^6$ |
| 8 | ~$10^1$ | >$10^6$ |

Ion Species: Al
Dose: $10^{17}$ cm$^{-2}$

TABLE 3

Dependency of Implant Layer Resistance to B Ion Implant Energy

| Implant Energy (MeV) | Resistance in Measurement Method 1 (Ω) | Resistance in Measurement Method 2 (Ω) |
| --- | --- | --- |
| 1 | ~$10^0$ | ~$10^2$ |
| 2 | ~$10^0$ | ~$10^3$ |
| 4 | ~$10^1$ | ~$10^4$ |
| 6 | ~$10^1$ | ~$10^5$ |
| 8 | ~$10^1$ | >$10^6$ |

Ion Species: B
Dose: $10^{17}$ cm$^{-2}$

Ion Species: B
Dose: $10^{17}$ cm$^{-2}$

TABLE 4

Dependency of Implant Layer Resistance to Cu Ion Dose

| Dose (cm$^{-2}$) | Resistance in Measurement Method 1 (Ω) | Resistance in Measurement Method 2 (Ω) |
| --- | --- | --- |
| 3 × $10^{15}$ | >$10^6$ | >$10^{10}$ |
| 0.7 × $10^{16}$ | ~$10^5$ | ~$10^{10}$ |
| 1 × $10^{16}$ | ~$10^2$ | ~$10^8$ |
| 1 × $10^{17}$ | ~$10^1$ | ~$10^5$ |
| 3 × $10^{17}$ | ~$10^{-1}$ | ~$10^5$ |

Ion Species: Cu
Implant energy: 4 MeV

TABLE 5

Dependency of Implant Layer Resistance to Al Ion Dose

| Dose (cm$^{-2}$) | Resistance in Measurement Method 1 (Ω) | Resistance in Measurement Method 2 (Ω) |
| --- | --- | --- |
| 3 × $10^{15}$ | >$10^6$ | >$10^{10}$ |
| 0.7 × $10^{16}$ | ~$10^4$ | >$10^{10}$ |
| 1 × $10^{16}$ | ~$10^2$ | ~$10^9$ |
| 1 × $10^{17}$ | ~$10^1$ | ~$10^6$ |
| 3 × $10^{17}$ | ~$10^{-1}$ | ~$10^6$ |

Ion Species: Al
Implant energy: 4 MeV

Ion Species: Al
Implant Energy: 4 MeV

Figure 8:
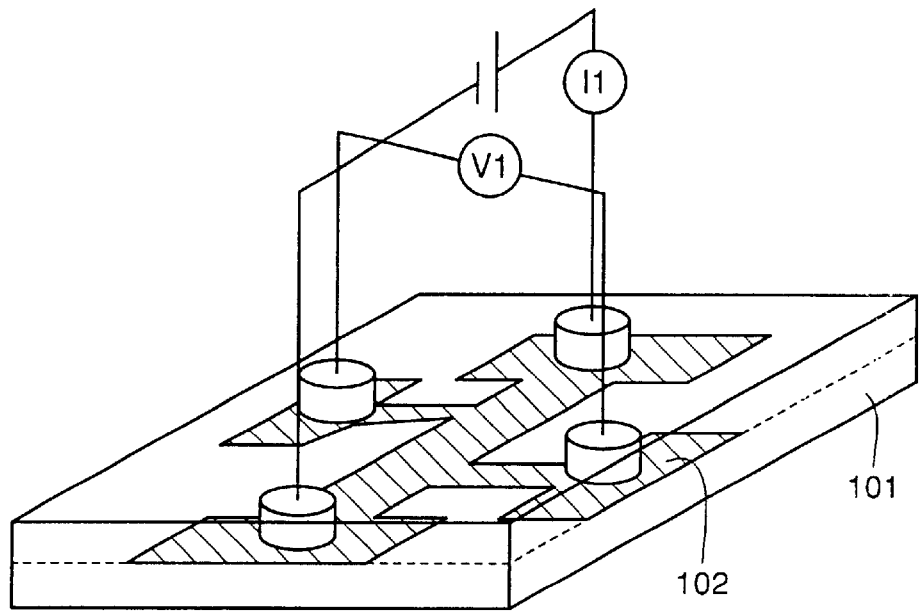
FIG. 8 is a schematic perspective view for illustrating a measurement method (1)
Figure 9:
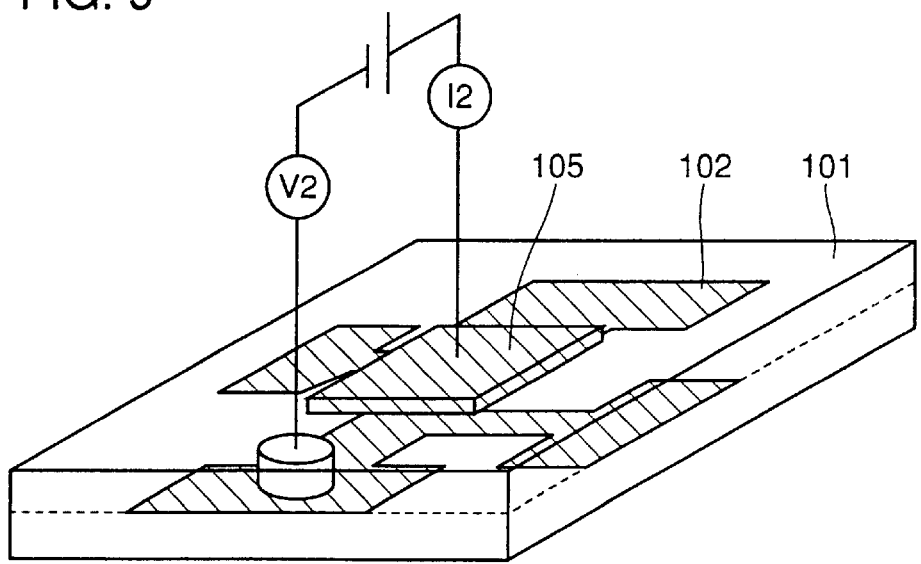
FIG. 9 is a schematic perspective view for illustrating a measurement method (2)
Figure 10:
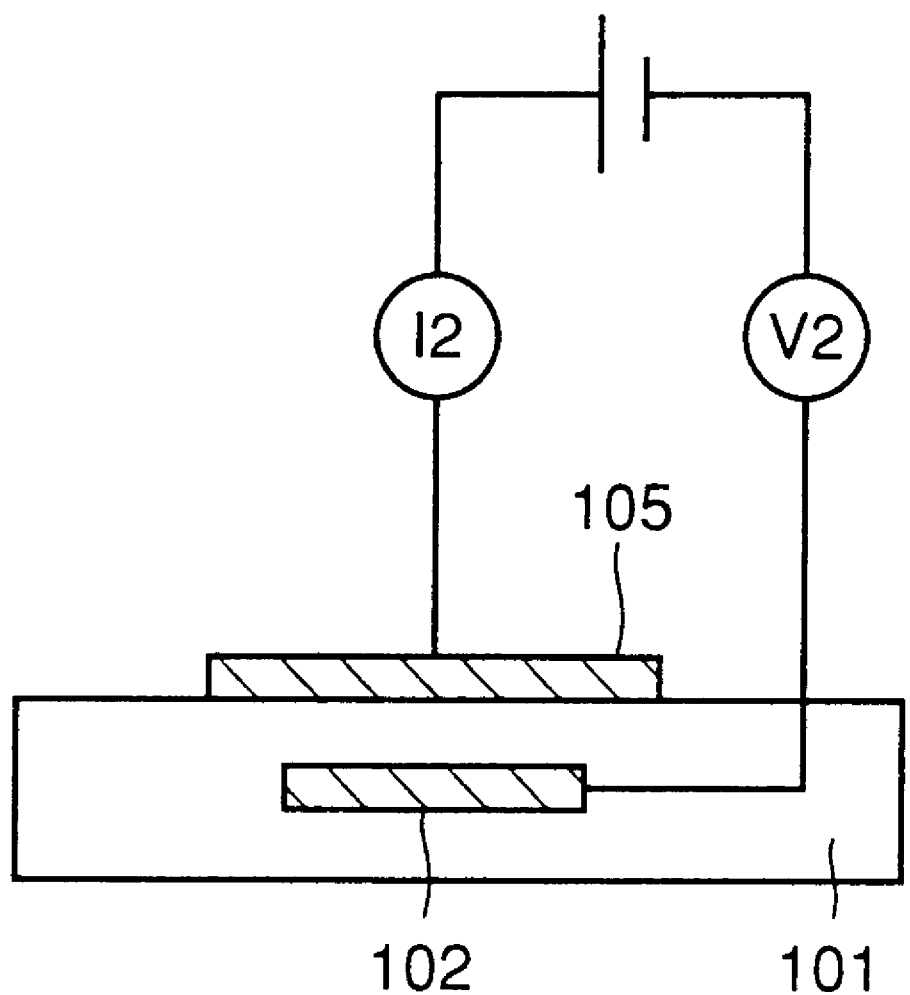
FIG. 10 is a schematic section view for illustrating a measurement method (2)

The above results show resistance values measured by two types of methods, i.e. a measurement method 1 and a measurement method 2. In the measurement method 1, evaluation was made for a resistance value of implantation region 102, determined by a ratio of flowing current I1 to a measured voltage V1 when a voltage is applied to both ends of implantation region 102 as shown in FIG. 8. Further, in measurement method 2, evaluation was made for a resistance value determined by a current-voltage property between implantation region 102 and a surface electrode 105, as shown in FIGS. 9 and 10. It is noted that FIG. 10 is a sectional view of FIG. 9.

From the results in Tables 1 to 3, it can be seen that increase of the implanting energy increases the depth of the implantation region and the resistance between the region and the surface layer. Further, the results in Tables 4 and 5 show that, when dose is equal to or more than 1×$10^{16}$ cm$^{-2}$, the implantation region formed by the implantation is made metallic, forming a low resistant layer.

Preferably, the depth of the implantation region is at least 0.5 μm.

Example 2

An experiment was performed in that an implantation region of metal elements was formed by a method similar to that of Example 1, and current is incrementally applied to an electrode. Compared to a small electrode (having a width of 1 μm) formed on or in a glass, a small electrode (having a width of 1 μm) formed in diamond had a variation in the resistance even with a high power supply (2 to 3 W), and damage to the electrode was observed. This shows that the electrode in diamond has a large electrical power resistance.

Example 3

Figure 11A:
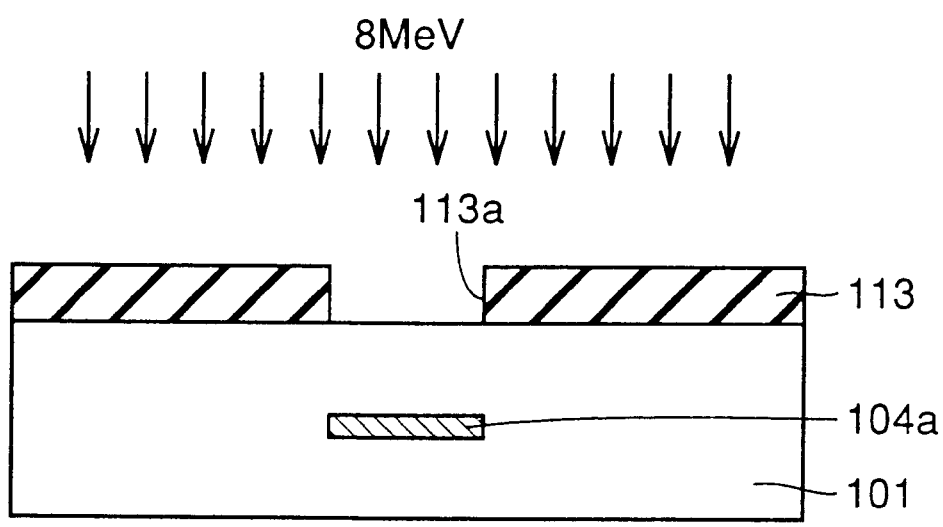
FIGS. 11A, 11B, 12A and 12B are sectional and planar views sequentially showing steps of a manufacturing method of a diamond interconnection substrate according to the third embodiment of the present invention.
Figure 11B:
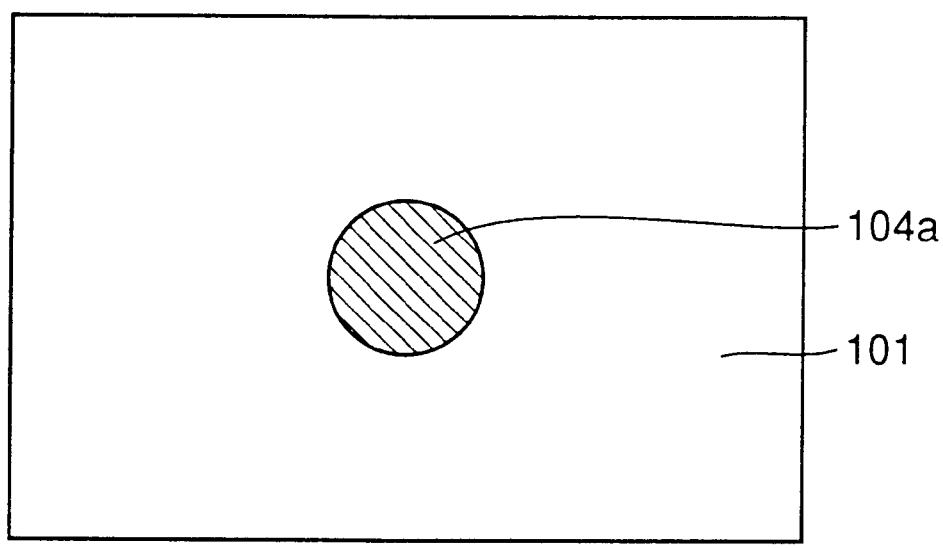

First, referring to FIGS. 11A and 11B, a metal mask or a mask 113 formed of a mask material was disposed or formed on a diamond substrate 101. Thereafter ions were implanted with a predetermined implanting energy level through mask 113. As a result, an implantation region 104a was formed at a predetermined depth in the diamond substrate 101.

Figure 12A:
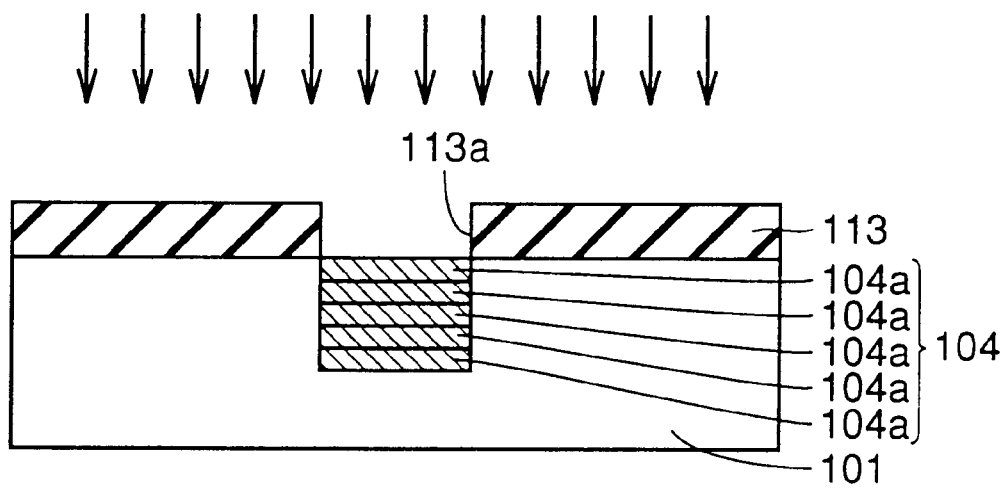
Figure 12B:
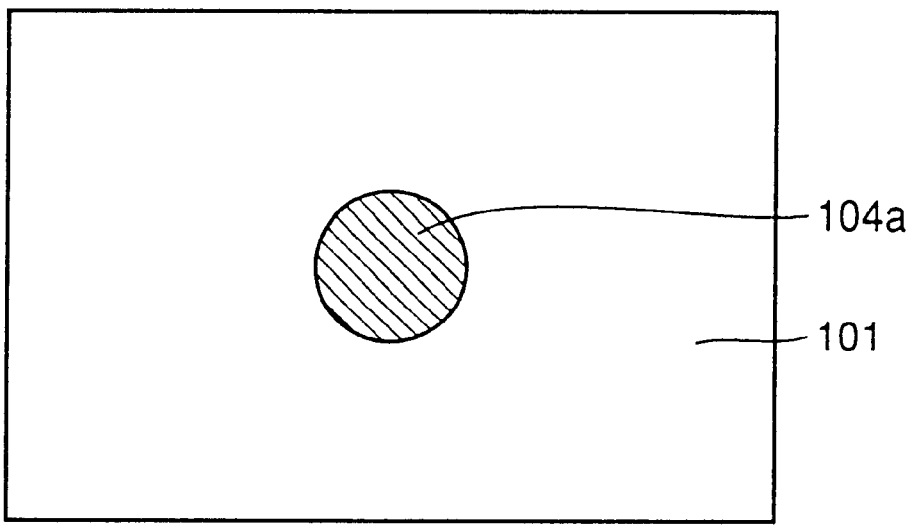

Subsequently, implantation was performed at different energy levels at intervals (such as 8 MeV, 6 MeV, 4 MeV, 2 MeV, 0.4 MeV, 100 keV and 40 keV), such that profiles of implantation regions are overlapped with each other from a high energy (8 MeV) to a low energy (~40 keV) as shown in FIGS. 12A and 12B. It was found that energy variation changes the implantation depths (thickness of the implantation layer) and decreases the resistance value of a surface layer, resulting in conduction to the surface. Conductive connection to the surface realized a resistance qual to or less than 10 Ω. This was determined from the results in Tables 1 to 3, considering the fact that these results were obtained through contact resistance.

Implantation region 104 formed as such was applied for four pad portions in FIG. 8 and a pad portion to which V2 contacts in FIG. 9.

Example 4

Figure 13A:
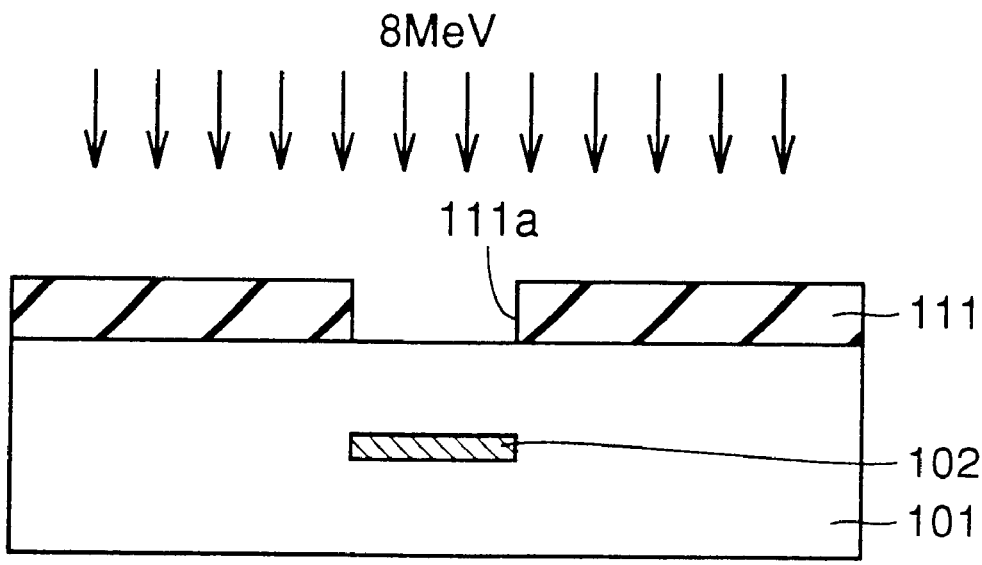
FIGS. 13A, 13B, 14A and 14B are sectional and planar views sequentially showing steps of a manufacturing method of a diamond interconnection substrate according to the fourth embodiment of the present invention.
Figure 13B:
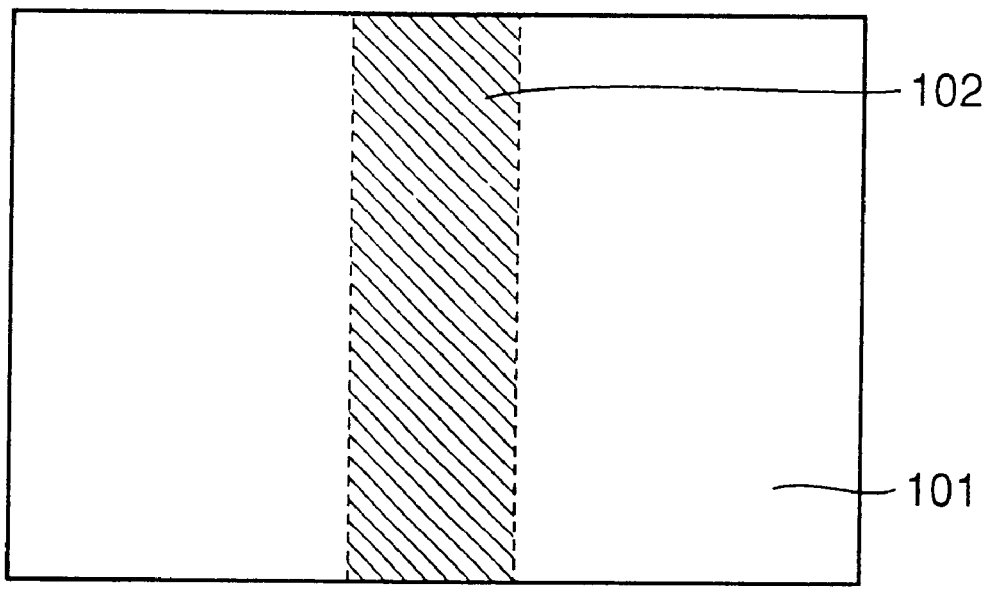
Figure 14A:
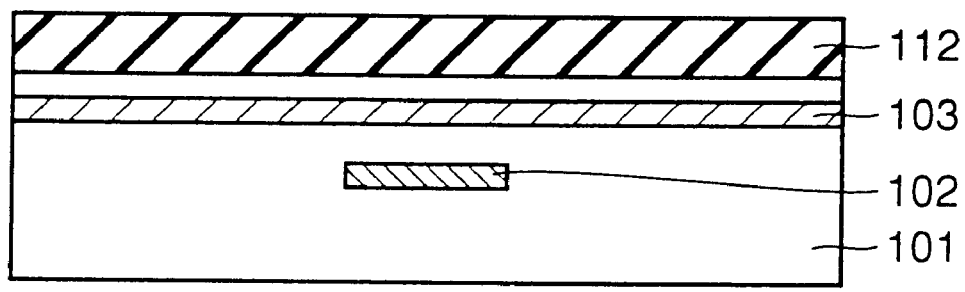
Figure 14B:
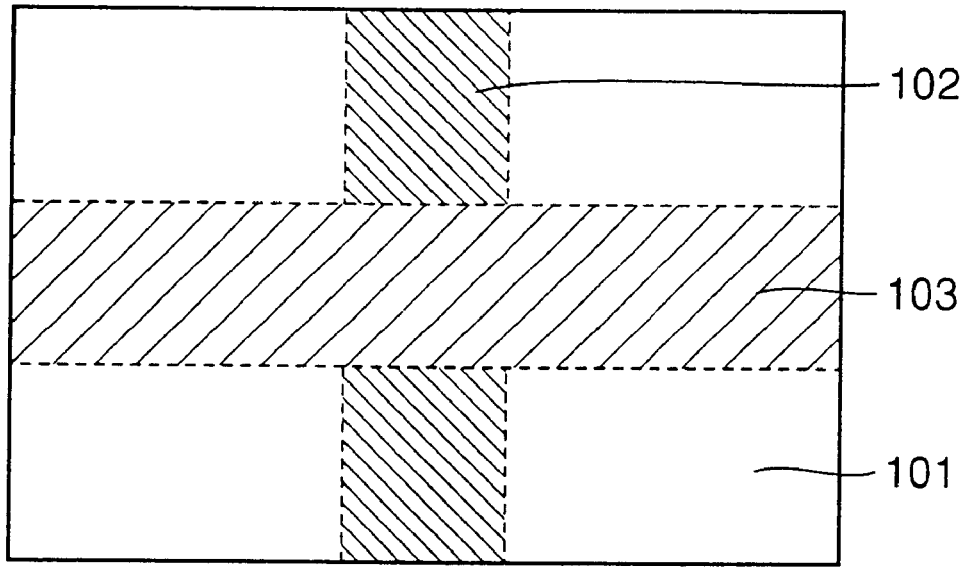
Figure 15A:
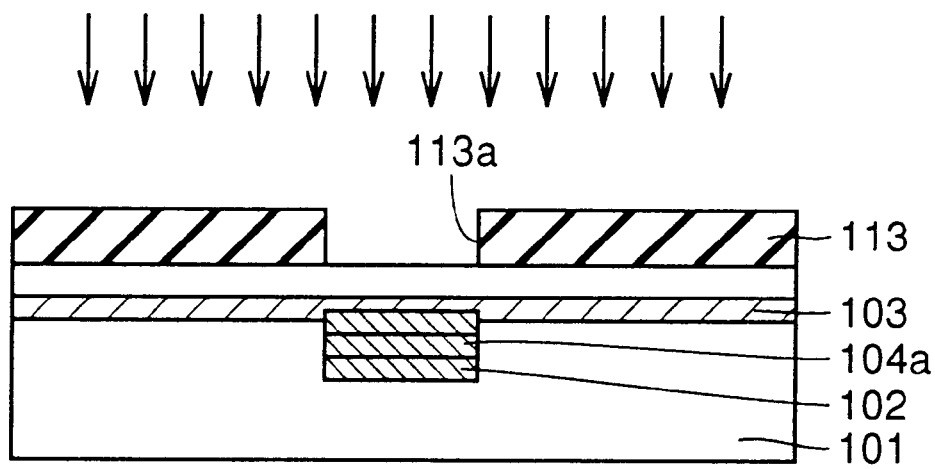
FIGS. 15A and 15B are sectional and planar views showing a manufacturing method of a diamond interconnection substrate according to the fifth embodiment of the present invention.
Figure 15B:
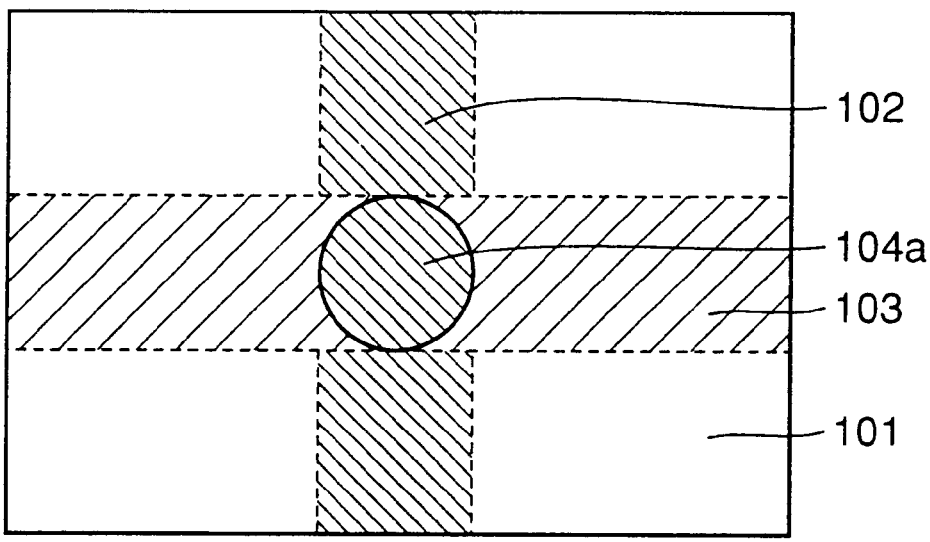

First, referring to FIGS. 13A and 13B, a mask 111 having a linear opening pattern 111a was disposed or formed on diamond substrate 101, and thereafter ions were implanted with high energy (8 MeV) through the mask 111 to form an implantation region 102 of metal elements. Subsequently, as shown in FIGS. 14A and 14B, ions were implanted with low energy (2 MeV) through a mask 112 having an opening pattern extending in a direction orthogonal to implantation region 102. Thus, an implantation region 103 of metal elements was formed at a position shallower than implantation region 102.

It is noted that, in FIGS. 14A and 14B, the opening pattern of mask 112 is positioned directly above implantation region 103.

A profile of atoms in the depth direction was examined by SIMS (Secondary Ion Mass Spectrometry) for the obtained diamond interconnection substrate, to find a separated profile having two peaks. A resistance value between implantation regions 102 and 103 (interlayer resistance value) was examined to find a large value equal to or higher than 10 kΩ. By annealing in hydrogen plasma at 800 to 1000° C., interlayer resistance value showed a tendency to be increased by at least approximately one order. This showed that an implantation region of a multi-layer structure having a high interlayer resistance value could be formed.

Example 5

First, multi-layer structured implantation regions 102 and 103 as shown in FIGS. 14A and 14B were formed with high energy (8 MeV) and lower energy (2 MeV) by a method similar to that of Example 4. Subsequently, ion implantation was performed a number of times, with different implant energy levels of 8, 6, 4 and 2 MeV, to a crossing portion of implantation regions 102 and 103. Thus, a plurality of implant layers 104a were formed for electrically connecting implantation regions 102 and 103. Thus, it was observed that the interlayer electrical resistance decreases from a large value equal to or more than 10 kΩ to a small value equal to or less than 10Ω.

Figure 16A:
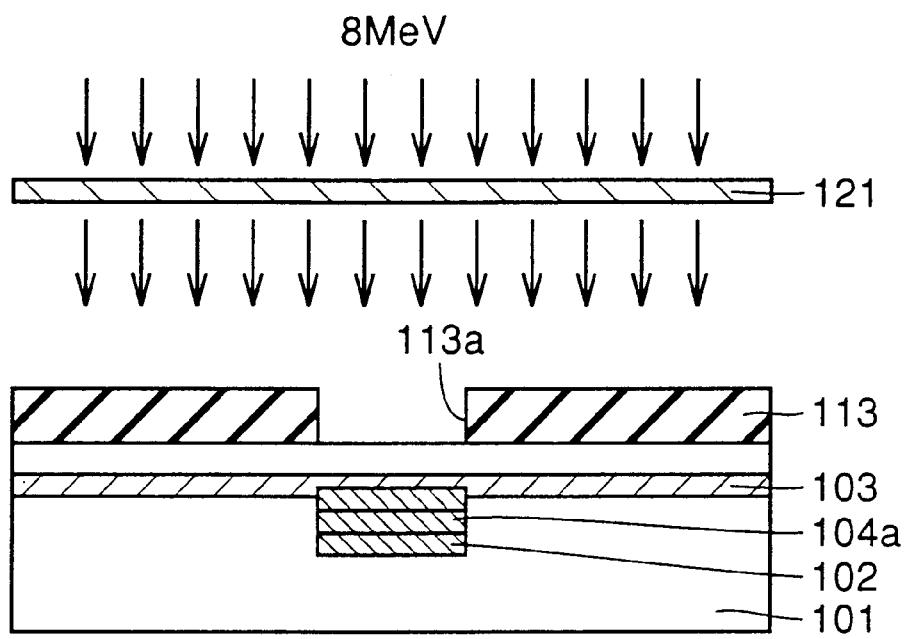
FIGS. 16A and 16B are sectional and planar views showing another manufacturing method of the diamond interconnection substrate according to the fifth embodiment of the present invention.
Figure 16B:
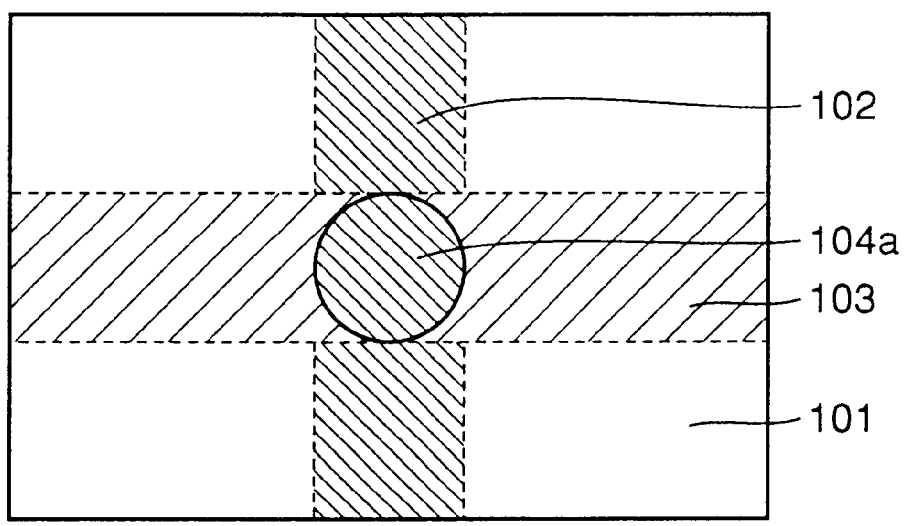

Though the description was made for the case where the implanting energy was varied, constant implanting energy may be used to form the same configuration as above. Referring to FIGS. 16A and 16B, the implanting energy was made constant to be 8 MeV and a thin film 121 was placed before the implantation surface. By changing the thickness of the thin film, the energy with which ions are implanted into diamond substrate 101 may be varied almost continuously. This also made it possible to obtain a small value of interlayer electric resistance equal to or less than 5Ω.

Example 6

Figure 17A:
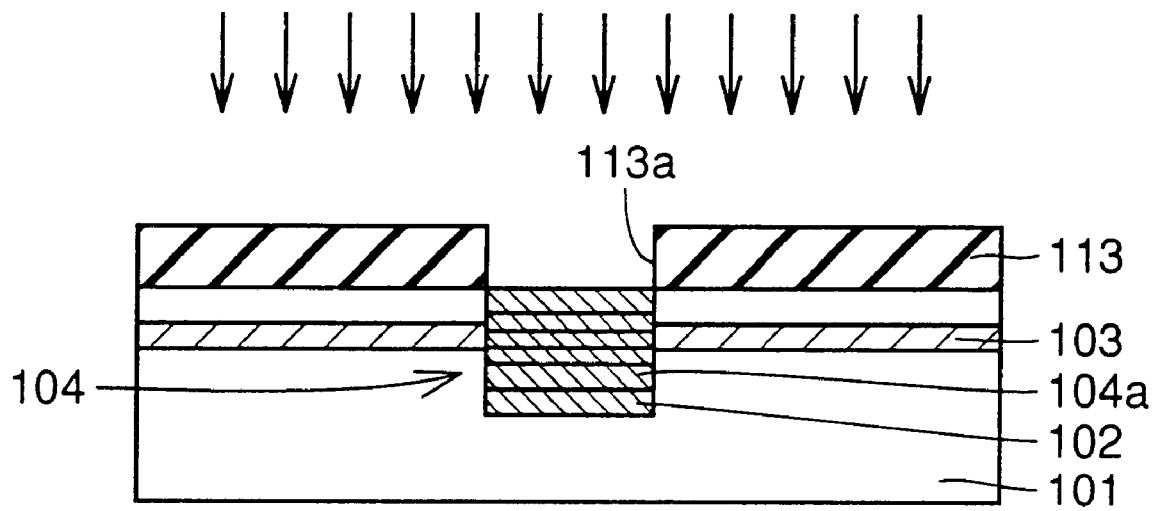
FIGS. 17A and 17B are sectional and planar views showing a manufacturing method of a diamond interconnection substrate according to the sixth embodiment of the present invention.
Figure 17B:
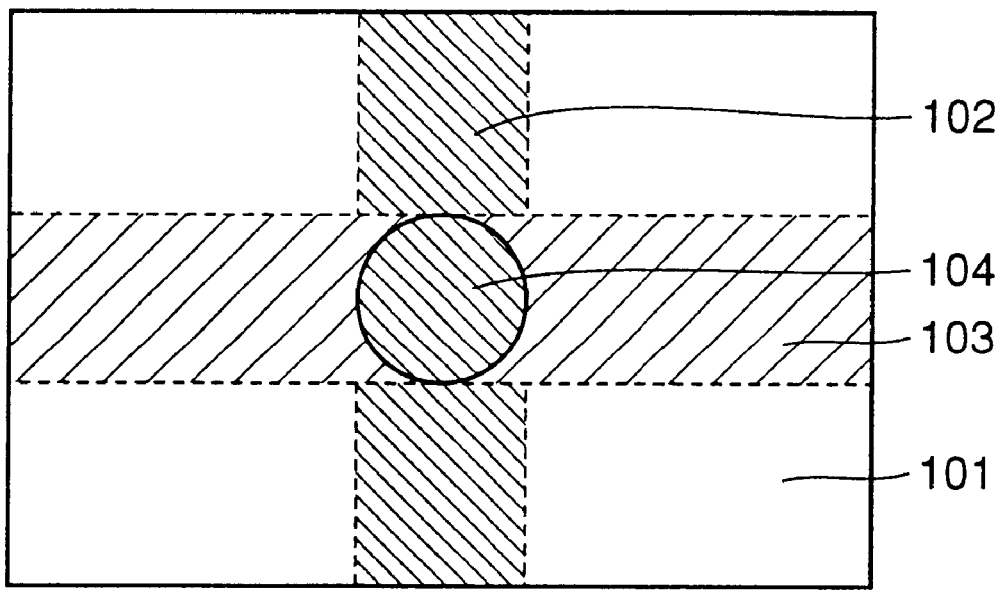

An implantation region was formed between layers and on the top surface by a method similar to that of Example 5 in combination with the method of Example 3, to form an implantation region 104 that acts as a contact layer between implantation regions 102 and 103 as shown in FIGS. 17A and 17B. The contact layer 104 reaches the surface of the diamond interconnection substrate 101. Further, the contact resistance value in this configuration was almost equal to that in Example 3.

Example 7

Figure 18A:
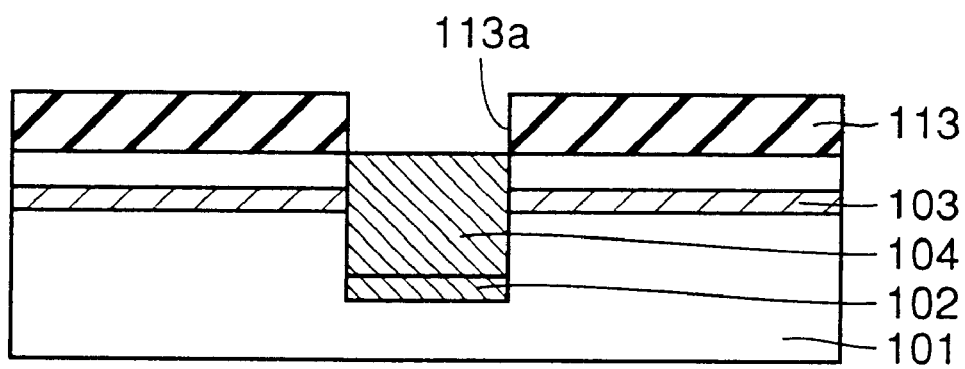
FIGS. 18A and 18B are sectional and planar views showing a manufacturing method of a diamond interconnection substrate according to the seventh embodiment of the present invention.
Figure 18B:
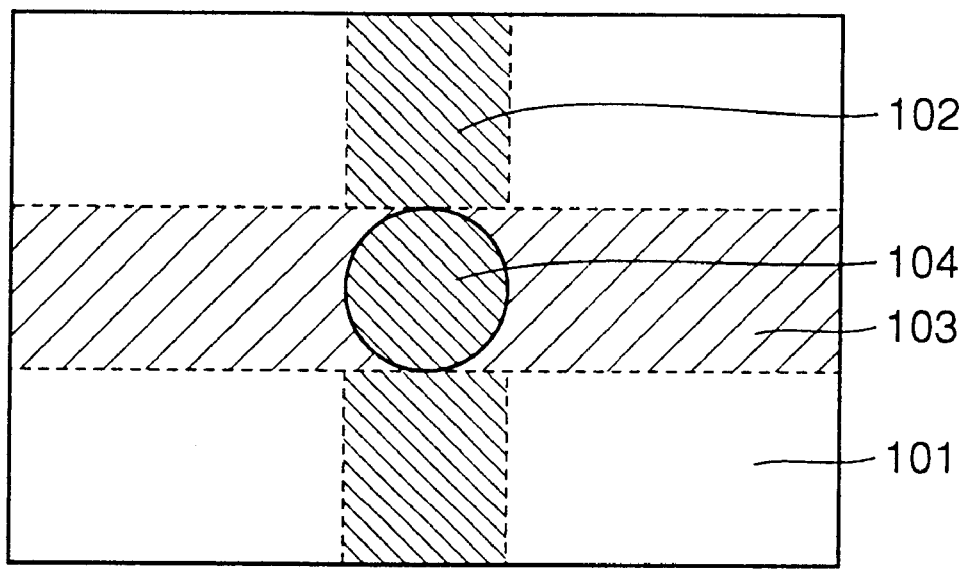

Referring to FIGS. 18A and 18B, interlayer insulated implantation regions 102 and 103 were formed in diamond substrate 101 by a method similar to that of Example 4. Subsequently, a crossing portion between implantation regions 102 and 103 was etched by RIE (Reactive Ion Etching) or ion beam etching processes until the etching reaches implantation region 102. The etched out hole was implanted or filled with metal having a melting point of 500° C. or lower to form the contact layer 104 acting as an electrode. Because of a poor wetting property of low melting metal to diamond, Ti may be deposited in the hole to increase adhesion of the metal therein, which otherwise is low, resulting in an optimal electrode isolation.

Example 8

Figure 19A:
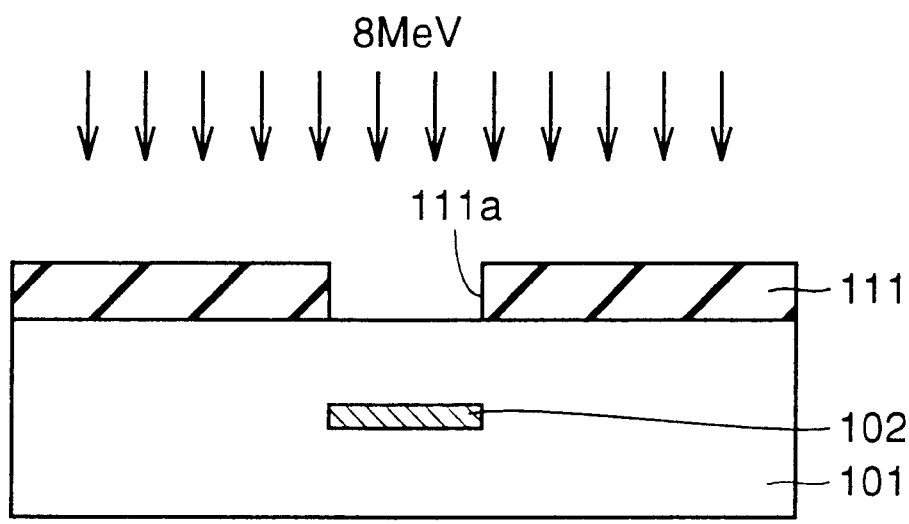
FIGS. 19A, 20A and 21A are sectional views sequentially showing steps of a manufacturing method of a diamond interconnection substrate according to the eighth embodiment of the present invention.
Figure 19B:
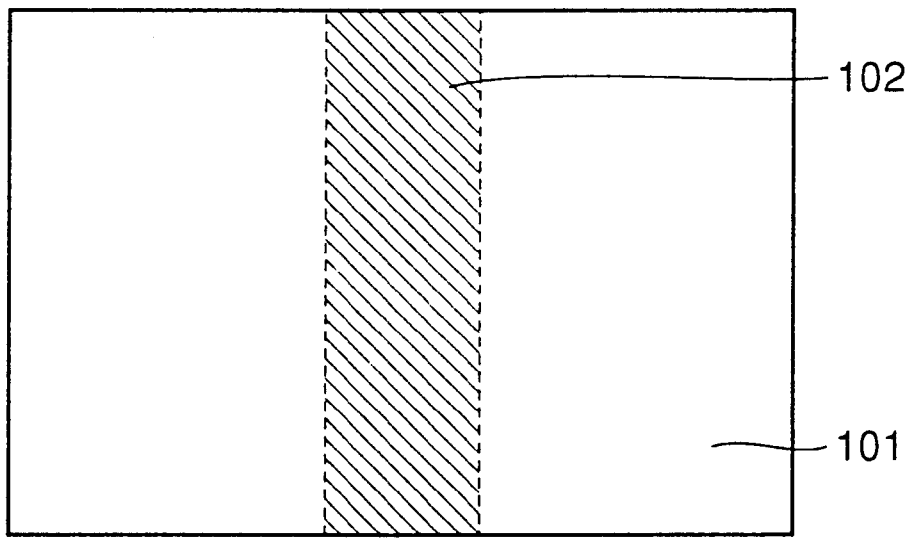
FIGS. 19B, 20B and 21B are planar views sequentially showing steps of the manufacturing method of the diamond interconnection substrate according to the eighth embodiment of the present invention.
Figure 20A:
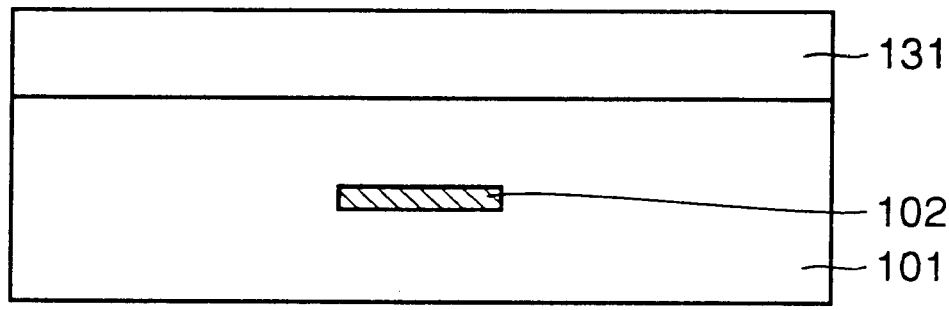
Figure 20B:
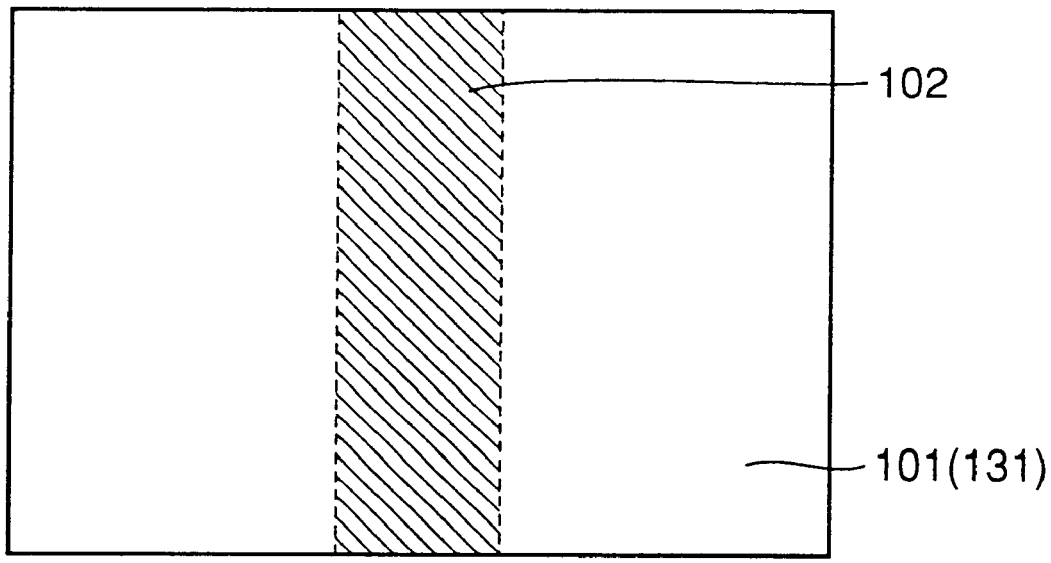
Figure 21A:
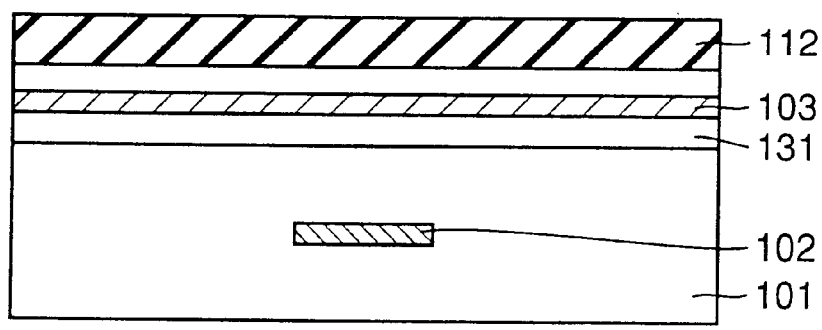
Figure 21B:
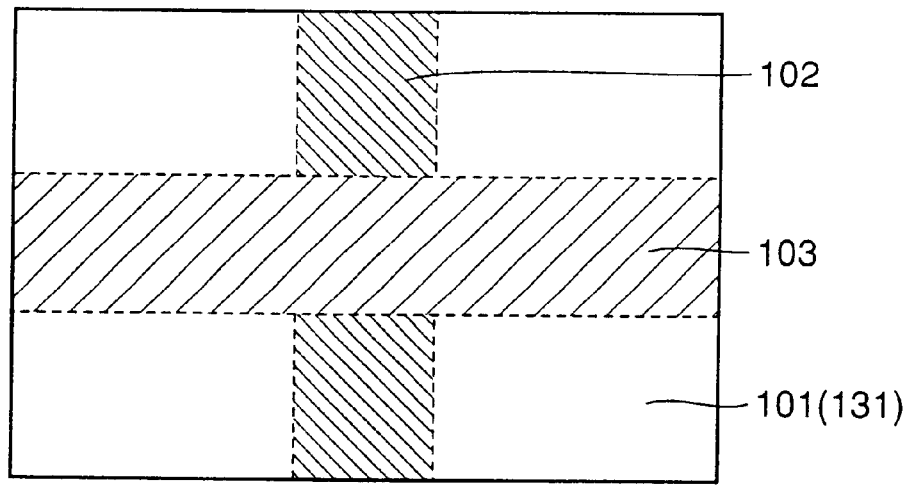

Referring to FIGS. 19A and 19B, an implantation region 102 having an appropriate pattern was formed by implanting Cu ions into diamond substrate 101 with energy of 8 MeV, as in the case with Example 1. Subsequently, non-doped diamond layer 131 having a thickness of at least 0.3 μm was formed on diamond substrate 101 by a vapor synthesizing method, as shown in FIGS. 20A and 20B. Thereafter, an implantation region 103 having another pattern was formed by implanting Cu ions with implanting energy of 2 MeV, as shown in FIGS. 21A and 21B. It is noted that, in FIGS. 21A and 21B, an opening pattern of mask 112 is positioned directly above implantation region 103.

By increasing the film thickness of a diamond layer 131 to be formed, interlayer insulation resistance was increased. When diamond layer 131 was formed having a thickness of at least 3 μm, interlayer insulation was secured even though the same ion implanting energy of 8 MeV was used for the second implantation. It was also possible to stack more than two layers, i.e. three, four or more layers.

As has been described above, according to the diamond interconnection substrate and its manufacturing method of the present invention, diamond having the highest thermal conductivity of all materials can be provided with multilayer interconnections, to attain a substrate suitable for a high-power electronic circuit substrate including a high-power microwave circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A diamond interconnection substrate, comprising:
   diamond; and
   a conductive layer constituted by a presence of metal elements having a thickness of at least 10 nm and a concentration of at least $10^{20}$ cm$^{-3}$ in said diamond.

2. The diamond interconnection substrate according to claim 1, comprising a plurality of said conductive layers,
   the plurality of said conductive layers being disposed at different depth positions with various distances from a surface of said diamond.

3. The diamond interconnection substrate according to claim 2, wherein the plurality of said conductive layers are electrically connected with each other in said diamond.

4. The diamond interconnection substrate according to claim 2, further comprising at least one electrode formed on the surface of said diamond,
   at least one of the plurality of said conductive layers being electrically connected to said at least one electrode.

5. The diamond interconnection substrate according to claim 1, wherein said metal elements constituting said conductive layer are metal elements of at least one species selected from a group consisting of Cu, Ag, Au, Pt, Mg and Al.

6. A method of manufacturing a diamond interconnection substrate, comprising the step of:
   ion implanting metal elements with energy of at least 1 MeV and a dose of at least $10^{16}$ cm$^{-2}$ into diamond to form a conductive layer constituted by said metal elements.

7. The method of manufacturing a diamond interconnection substrate according to claim 6, wherein
   said ion implanting is performed a number of times by varying implantation depths of said metal elements into said diamond.

8. The method of manufacturing a diamond interconnection substrate according to claim 7, wherein
   profiles of said metal elements implanted by the number of times of said ion implanting are overlapped with each other while being stacked in a depth direction to form a single said conductive layer.

9. The method of manufacturing a diamond interconnection substrate according to claim 7, wherein
   profiles of said metal elements implanted by the number of times of said ion implanting are disposed at different depth positions without overlapping with each other, to form a plurality of said conductive layers divided in multiple layers.

10. The method of manufacturing a diamond interconnection substrate according to claim 7, wherein
    at least one of implanting energy of said ion implanting and species of said metal elements is changed to vary an implantation depth of said metal elements in said ion implanting.

11. The method of manufacturing a diamond interconnection substrate according to claim 6, further comprising the step of synthesizing a diamond layer on a surface of said diamond by a vapor synthesizing process, said step of ion implanting the metal elements and said step of synthesizing said diamond layer after said ion implanting are repeated to form multi-layered said conductive layer disposed on planes different from each other.

12. The method of manufacturing a diamond interconnection substrate according to claim 6, wherein a mask layer formed on a surface of said diamond is patterned using a photolithography process, and said ion implanting is performed to said diamond through the patterned said mask layer, to form said conductive layer of a predetermined shape.

* * * * *

UNITED STATES PATENT AND TRADEMARK OFFICE
CERTIFICATE OF CORRECTION

PATENT NO.    : 6,423,982 B2
DATED         : July 23, 2002
INVENTOR(S)   : Nishibayashi et al.

It is certified that error appears in the above-identified patent and that said Letters Patent is hereby corrected as shown below:

Column 1,
Line 60, before "in", replace "$cm^{-1}$" by -- $cm^{-3}$ --.

Column 9,
Lines 47 and 48, delete the duplicate occurrence of the following:
"Ion Species Al
Implant Energy: 4 MeV".

Signed and Sealed this

Twenty-fourth Day of December, 2002

JAMES E. ROGAN
*Director of the United States Patent and Trademark Office*